United States Patent
Hau et al.

(10) Patent No.: US 7,427,897 B2
(45) Date of Patent: Sep. 23, 2008

(54) POWER AMPLIFIER WITH CLOSE-LOOP ADAPTIVE VOLTAGE SUPPLY

(75) Inventors: Gary Hau, Merrimack, NH (US); Peter Bealo, Plaistow, NH (US)

(73) Assignee: Fairchild Semiconductor Corporation, South Portland, ME (US)

( * ) Notice: Subject to any disclaimer, the term of this patent is extended or adjusted under 35 U.S.C. 154(b) by 264 days.

(21) Appl. No.: 11/350,220

(22) Filed: Feb. 8, 2006

(65) Prior Publication Data

US 2007/0182490 A1   Aug. 9, 2007

(51) Int. Cl.
 *H03G 3/20* (2006.01)
(52) U.S. Cl. ...................................... 330/297; 330/136
(58) Field of Classification Search ................. 330/133, 330/136, 140, 297
See application file for complete search history.

(56) References Cited

U.S. PATENT DOCUMENTS

| 6,081,161 | A | 6/2000 | Dacus et al. |
| 6,646,511 | B2 | 11/2003 | Canyon et al. |
| 6,741,127 | B2 * | 5/2004 | Sasho et al. ................ 330/136 |
| 6,900,692 | B2 | 5/2005 | Kim et al. |
| 6,900,697 | B1 | 5/2005 | Doyle et al. |
| 2002/0175764 | A1 | 11/2002 | Matsuura |
| 2005/0285681 | A1 | 12/2005 | Doherty |

FOREIGN PATENT DOCUMENTS

WO  0007294 A  2/2000
WO  03056698 A  7/2003

OTHER PUBLICATIONS

Asbeck P M et al: Gainp/Gass DHBTS for Power Amplifiers in Wireless Applications, Compound Semiconductors 1998. Proceedings of the 25th International Symposium on Compound Semiconductors. Nara, Japan, Oct., 112-16, 1998, Institute of Physics Conference Series, London: IOP, GB, vol. 1 NR. 162.
Larson L et al: Device and Circuit Approaches for Improved Wireless Communications Tranmitters, IEEE Personal Communications, IEEE Communications Society, US. vol. 6, No. 5, Oct. 1999.

* cited by examiner

*Primary Examiner*—Steven J Mottola
(74) *Attorney, Agent, or Firm*—Cesari and McKenna, LLP; Edwin H. Paul, Esq.

(57) ABSTRACT

A two-(or multi)stage power amplifier receives a variable RF input signal, and outputs an optimized. RF output signal from, for example, a mobile handset. The output power level from the handset is predetermined, as known in the art, by the received control signal from a base station. The first power amplifier stage amplifies the variable RF input signal and outputs an RF signal, Vin, to a power detector circuit and an RF signal to the second or next amplifier stage. The power detect circuit amplifies the Vin signal and rectifies that signal with a linearly biased diode and provides a detect signal to a DC to DC converter. The converter responds by providing an optimum voltage bias, which is linearly related to the DC voltage detect signal from the power detector, to the output stage, and, if desired, to the first and/or other stages of the power amplifier that optimizes the output power level while meeting the required linearity specification. The battery current consumption is optimized through this automatic, dynamically control of the supply voltage for the power amplifier at each output power level through the DC to DC converter.

10 Claims, 5 Drawing Sheets

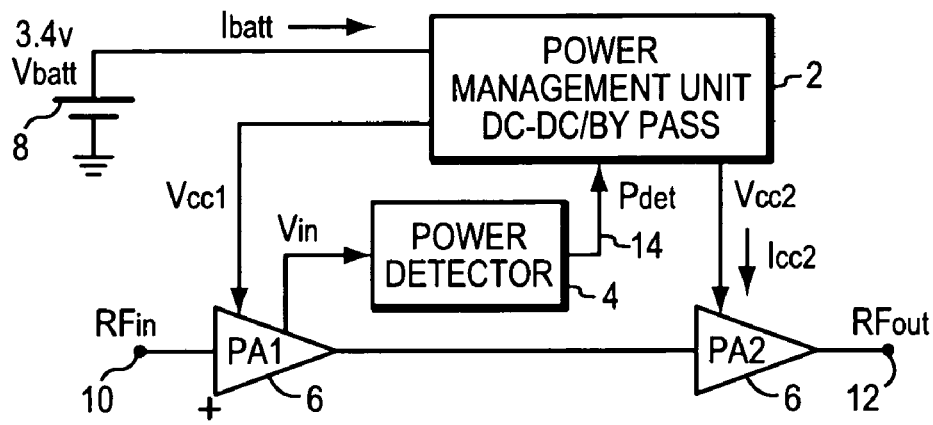
FIG. 1
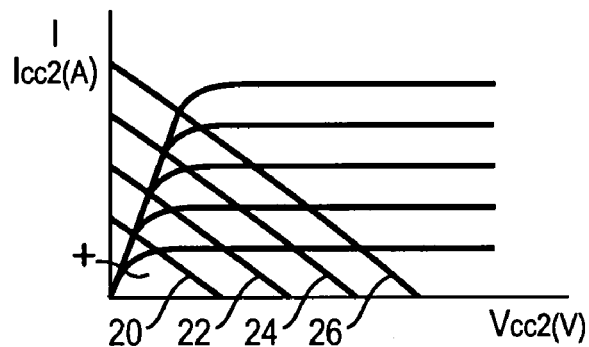
FIG. 2
FIG. 3

POWER AMPLIFIER WITH CLOSE-LOOP ADAPTIVE VOLTAGE SUPPLY

BACKGROUND OF THE INVENTION

1. Field of the Invention

The present invention relates to power amplifiers and, more particularly, to power amplifiers used in battery powered mobile handsets, and even more particularly to optimizing current use in such power amplifiers over a range of output power levels.

2. Background Information

Mobile handsets for wireless communication have become highly integrated to support new features such as multi-standard operation, camera, color display and high data rate transmission. The additional active components demand higher current consumption which, inevitably, shortens the battery life. On the other hand, wireless service providers and consumers demand long handset talk time from the next generation handsets. Hence, there is a constant need to reduce power consumption of the handset components in order to extend battery life.

The RF power amplifier is one of the main current consuming parts within handsets. Signals generated in a mobile handset are amplified by the power amplifier and sent to a base station for distribution to receivers. Often the frequency bands of operation of the handsets are predetermined, mainly in the frequency range from 800 MHz to 2000 MHz for various standards such as WCDMA (wide band code division multiple access) and CDMA (code division multiple access). The present invention, however, may find advantageous use at other frequencies and with other transmission standards.

In general, the handset is required to transmit at a high output power level when it is farther away from a receiving base station in order to maintain a pre-determined signal strength at the base station for sufficient reception. Conversely the closer the handset to the base station, less transmitted power would be required. Generally, the handset receives a control signal from the base station and, according to the embedded software command in this signal, adjusts the transmitted power accordingly. As known to those skilled in the art, the handset output signal has to meet the FCC regulation on spectral re-growth (as known as linearity—often measured in terms of adjacent channel leakage power ratio (ACLR) which stipulates the maximum allowable interference to other frequency channels in order to minimize interference between signals) with respect to the handset output power.

Handset power amplifiers are generally designed to meet the FCC spectral re-growth requirement at maximum transmit power level (+28 dBm for WCDMA system). Statistically, however, handsets transmit at maximum linear output power only for a small fraction of time, and most of the transmission takes place at a considerably lower power levels (10 dB or more below maximum linear power). The power added efficiency (PAE) of the conventional power amplifiers usually drops off rapidly under such backoff power operation, resulting in higher current draw coupled with excessive linearity margin. As known to those skilled in the art, the excessive linearity margin can be trade-off for low current consumption in power amplifiers.

U.S. Pat. No. 6,900,692 B2 ('692), to J. Kim et al., attacks this issue by disclosing a system that optimizes the output power levels at two discrete power output levels. Although, this improves overall efficiency, it remains inefficient at other power levels, and, as mobile devices proliferate, battery life is becoming more important in the competitive market.

U.S. Pat. No. 6,081,161 ('161) to F. L. Dacus et al. and U.S. Pat. No. 6,646,511 ('511) to J. C. Canyon et al. provide other solutions. Both of these patents teach monitoring the output power of the power amplifier through the current in the voltage bias line to the power amplifier. The detected current sets the optimized bias voltage for the power amplifier. However, the coupling loss (typically through a resistor or a current mirror) in the bias line would cause voltage drop especially under high current operation, reducing the bias voltage available to the power amplifier and resulting in performance degradation.

Another limitation of prior art power amplifiers ('511) is their use of external look up tables that are part of complex feedback loops for adjusting the power amplifier supply voltage. Such control schemes require additional calibration procedures and the operation is not adaptive within the power amplifier.

Another limitation of prior art power amplifiers ('161) is their dynamic control of the DC bias current through the gate node of the power amplifiers. As known to those skilled in the art, this technique is ineffective in reducing current consumption of the power amplifiers over different output power level as compared to reducing the collector or drain bias supply voltage of the power amplifier.

The prior art, generally, remains either inefficient in current consumption over a wide range of power or requires complex control circuitry with external input.

U.S. Pat. No. 6,900,697 ('697) to J. T. Doyle provides another solution. This patent teaches adjusting the supply voltage of the power amplifier based on an external power control signal and the output power of the power amplifier measured at the output of the power amplifier. The need of an external control signal makes the current consumption optimization non-adaptive which increases the control complexity.

The present invention is directed to dynamically optimizing current consumption and linearity of a power amplifier at each power level without the need for any external control in order to provide automatic current optimization for performance improvement while extending battery life.

SUMMARY OF THE INVENTION

The above limitations of the prior art are avoided and other advantages are provided by the present invention. The present invention provides for, at least, a two-stage power amplifier, where the bias voltage applied to the power amplifier varies dynamically with the output power. As discussed above, when the handset is nearer the base station, a lower output power can be used that will conserve battery life as a result of reduced current consumption at low bias supply voltage while still meeting the linearity specification.

In the example of the present invention using a two-stage amplifier the bias voltage is fed to the output stage, but may be also fed to both stages. If more stages are used the bias may be fed to one or more of the stages as the designer may determine. In the remaining discussion the present invention is not meant to be limited to only two stages.

The present invention in response to a new RF input signal provides for monitoring the output power by sensing the resulting RF output signal power from the first-stage. The change in input power level results from a change in handset transmitted power requested by the control signal sent from the base station to the handset. The sensed output power level from the first stage is detected via a power detector which sends a signal to a DC to DC converter. The converter responses to a change in output power by changing the bias voltage to the first and second or final output stage of the power amplifier. The output power level, and the gain, is determined by the bias voltage at the output and other stages, and is uniquely corresponded to a particular input power level. The optimum bias voltage is dependent upon the output power of the power amplifier in order to maintain the minimum linearity requirement. Reduced current consumption is achieved with the optimum bias voltage supplied from the DC to DC converter at all power levels. The percentage of current saving with this invention over a power amplifier with a fixed bias voltage is:

$$\left(1 - \frac{\text{optimum voltage bias for power amplifier}}{\text{battery voltage for DC to DC converter} \times \text{DC to DC converter efficiency}}\right) \times 100\%$$

A particular embodiment of the present invention provides advantages compared to prior art circuits. Some of these advantages are: a) the power detection circuit is simple and consumes negligible power, b) a biased diode rectifies and senses (an amplified) RF signal and provides a DC voltage that is a measure of the optimum output power, c) the DC voltage detect signal is linearly related to the optimum supply voltage for the power amplifier, d) adaptive and automatic control of the optimum bias voltage for the power amplifier which does not require any external control mechanism.

In a preferred embodiment, when maximum power output is required a bypass circuit effectively places the full battery voltage as the bias voltage on the power amplifier output stage thereby providing sufficient linearity at the maximum power output, minimizing any voltage drop across the DC to DC converter as a result of resistive loss which would degrade the performance of the power amplifier.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which:

FIG. 1 is a circuit block diagram of a system employing the present invention;

FIG. 2 is a graph illustrating the various load lines for the power amplifier of a system of FIG. 1;

FIG. 3 is a graph of ACLR1 versus output power;

DETAILED DESCRIPTION OF AN ILLUSTRATIVE EMBODIMENT

Figure 4:
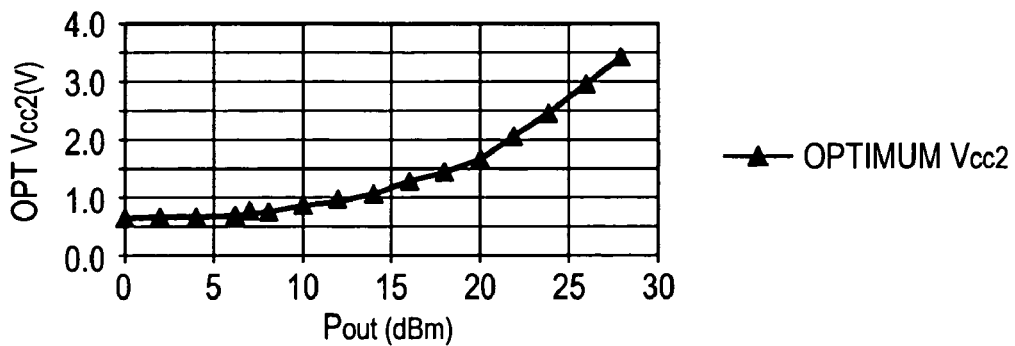
FIG. 4 is a graph of optimum bias voltage Vcc2 (to the output stage) versus output power.

FIG. 1 is a block diagram of a system employing the present invention and includes a power management unit 2, a power detector 4, a 3.4V battery 8, and two power amplifiers 6, PA1 and PA2. Consider the circuit of FIG. 1 is part of a handset that has just been turned on and has received a new RF control signal from a base station. In this case, the RFin signal 10 is changed to a level such that the circuit of FIG. 1 will deliver the optimum, pre-determined output power at the RFout signal 12 which corresponds to that particular RFin signal level. Vin is an RF signal sensed from the output of the first power amplifier PA1 that is input to the power detector 4. The power detector 4 outputs a DC voltage Pdet to a DC to DC converter in the power management unit 2. The DC to DC converter responds by providing optimum Vcc1 and Vcc2 to PA1 and PA2, respectively. In most instances Vcc1 equals Vcc2, but in other application these voltages may be different. The circuitry is powered from a battery of +3.4V, which is common in the art, and, although not shown, there may be more than two PA's in other preferred embodiments using the present invention.

FIG. 2 illustrates the optimum load lines 20, 22, 24, 26 that correspond to different output power levels for the power amplifier while maintaining sufficient output linearity. Line 26 illustrates, say, the maximum output power which corresponds to the highest bias supply voltages (Vcc1 and/or Vcc2) as shown in FIG. 1, while load line 20 may illustrate the minimum which corresponds to the lowest Vcc1 and/or Vcc2 as shown in FIG. 1. In some preferred embodiments the maximum may be, as mentioned before, 28 dBm and the minimum may be −10 dBm. Other maximum and minimum power levels may be used in other systems or applications. In the present embodiments the present invention will allow, substantially, for the system to assume virtually any load line between 20 and 26. In this way, compared to some prior art systems, the present invention provides the optimum bias supply voltage for the power amplifier at all output power levels for virtually all requirements.

The "optimum" power level, which corresponds to a particular bias supply voltage (Vcc2 in FIG. 1), is constrained by the ACLR1 linearity specification mentioned above. FIG. 3 shows the performance of a preferred embodiment of the present invention in trace 30. The trace 32 illustrates an amplifier biased with a fixed bias voltage at 3.4V, which corresponds to the optimum bias supply voltage Vcc2 required for maximum output power. The optimum bias voltage operation provides the most efficient current consumption for each power output level while satisfying the linearity requirements. The abscissa (horizontal axis) is in dBm and the ordinate (vertical axis) is in dBc. As pointed out before the figure-of-merit for interference between adjacent channels is at least −40 dBc.

FIG. 4 is a graph of the output power level Pout in dBm versus the optimum Vcc2 supplying voltage to the power amplifier output stage PA2. The high power side is 28 dBm where the optimum Vcc2 is at the highest level at about 3.4 V. The optimum Vcc2 at the lowest power side, say from +5 dBm and below, is at about 0.5V. It is noted that Vcc2 changes dynamically according to the output power level, rather than staying constant as powered by a fixed +3.4V battery voltage.

Figure 5:
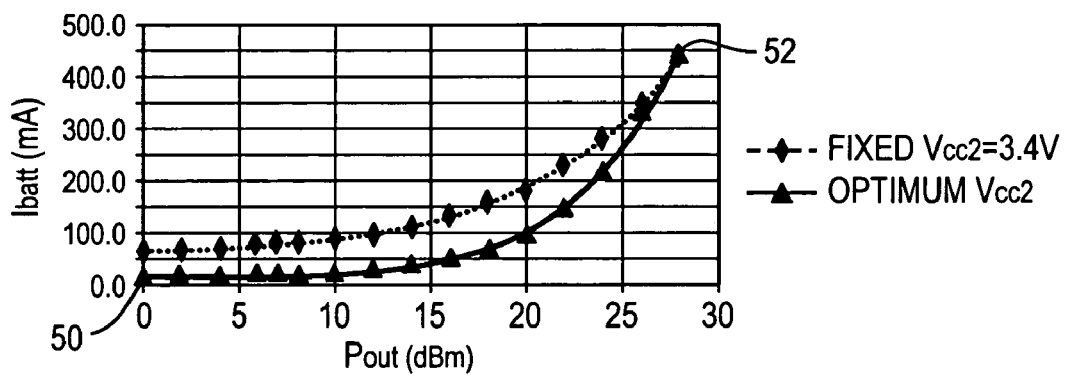
FIG. 5 is a graph of battery current between the present invention and a prior art system.

FIG. 5 illustrates the battery current consumption (Ibatt) of the optimum power amplifier embodiment of the present invention compared to a power amplifier powered by a fixed +3.4V battery. At 0.0 dBm location 50 the current savings is over 50 mA from the battery while at the +28 dBm location 52 the current draws are equal between the two systems. Since this is the maximum output power, the full battery voltage is applied in both systems, so the current draw will be equal. But, notice that the battery current savings are 50 mA or more at output power below +25 dBm. Significant reduction in current consumption is achieved over a wide range of output power. The battery current consumption is calculated as:

$$Ibatt = \frac{Vcc2 \times Icc2}{Vbatt \times \text{DC to DC converter conversion efficiency}}$$

Statistically, handsets transmit at maximum linear output power only for a small fraction of time, and most of the transmission takes place at a considerably lower power levels (10 dB or more below maximum output power). Therefore, substantial battery current is saved for, probably, 95% of the time when the handsets are in use.

Figure 6:
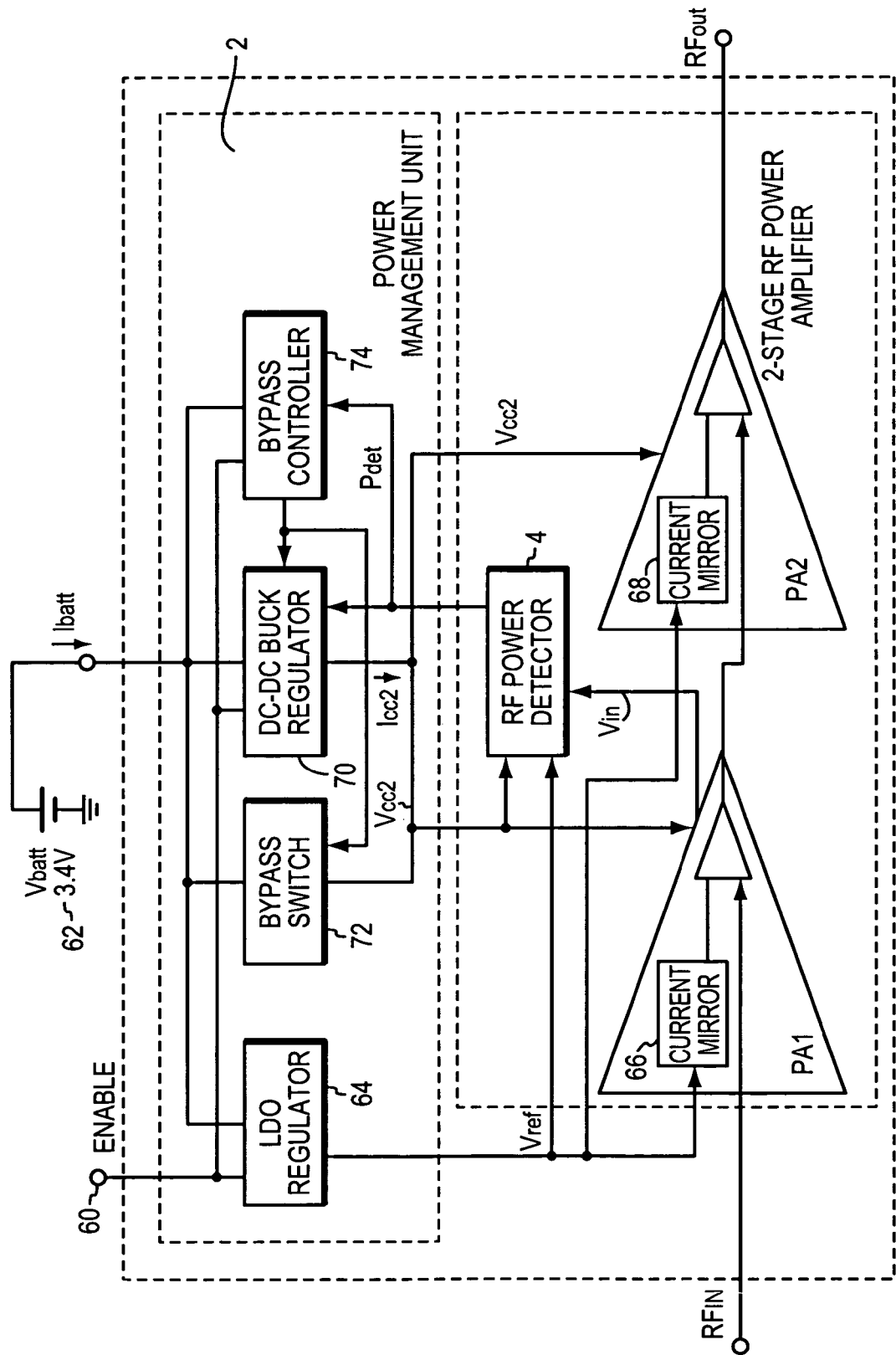
FIG. 6 is a more detailed circuit block diagram of the system of FIG. 1.

FIG. 6 is a more detailed circuit block diagram of FIG. 1 illustrating a preferred embodiment incorporating the present invention that includes a power management unit 2, a power detector 4 and two PA's. Here the PA's are shown with a current mirror usually found in such amplifiers, as is known to those skilled in the art. The ENABLE 60 signal is true when the handset is in transmit mode sending RF signals to a base station antenna. In some cases the ENABLE 60 may be true whenever the handset is turned on. The circuit is powered by a +3.4V battery 62 (Vbatt) that supplies current Ibatt.

The power management unit 2 contains an LDO (low dropout regulator, known in the art) that provides a stable reference voltage, Vref, of +2.85V to bias the current mirrors 66, 68 that are typically found in such power amplifiers. In an example, the LDO's +2.85V is also used in the power detector 4 and/or in other circuit as the designer may determine.

There is a DC to DC converter 70, in this example a "buck" converter, whose design is known to those in the art. The DC to DC converter is designed to power by the +3.4V battery and provide an output bias voltage, here Vcc2, that goes to both PA1 and PA2. In this example the Vcc2 ranges from a low of about 0.5V to about +3.0V. The +3.0V is the maximum voltage output of the typical DC to DC buck converter due to its compliance with the +3.4V input. At that point, a bypass switch is activated and through this switch virtually the full +3.4V is applied to the PA's. There is a bypass controller 74 that activates the bypass switch 72 when the Pdet reaches a given DC voltage set point that corresponds to a Vcc2 from the DC to DC converter of about +3.0V.

Also, the descriptions and data herein refer to an embodiment of the present invention operating at a frequency of 1.950 GHz and with a battery supply of +3.4V. As indicated elsewhere herein other frequencies and battery voltages may be used in other applications. Also, as would be known to those skilled in the art, virtually any DC to DC converter design, reference voltage (LDO) design, bypass switch design, bypass controller design, and power amplifier design could be advantageously used in embodiments with the present invention.

Figure 7:
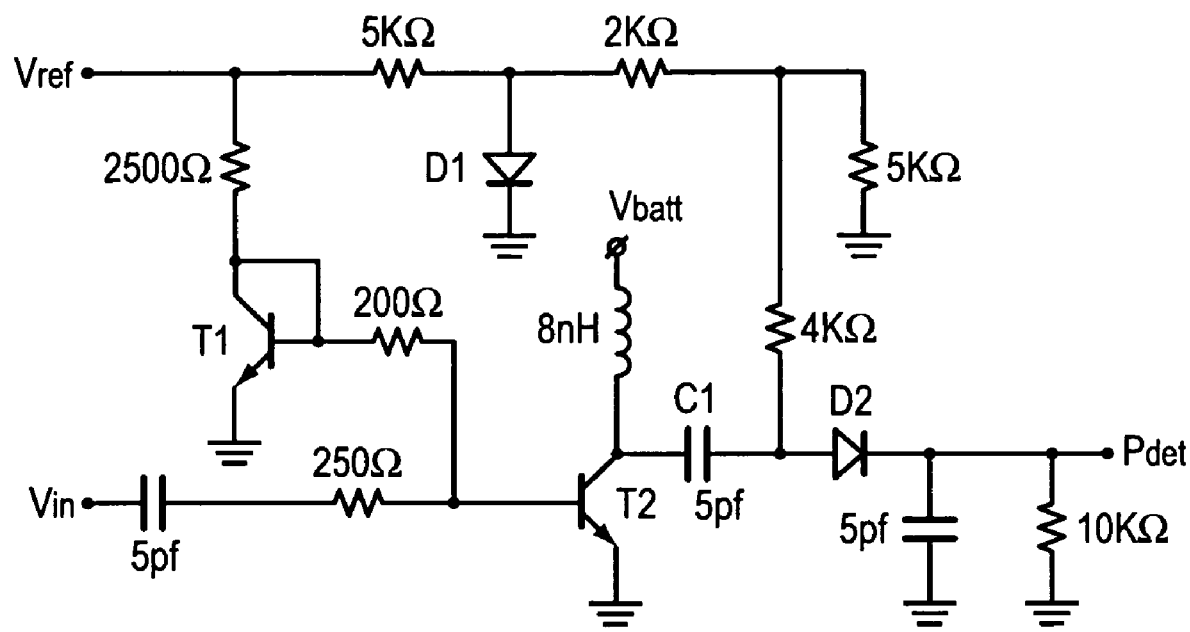
FIG. 7 is a circuit schematic of the power detector of FIG. 6.

FIG. 7 is a detail of the power detector circuit of FIG. 6. The Vin is the RF output signal from the first power amplifier, PA1. That signal is amplified by the transistor T2 to increase the RF signal level for power detection. The DC bias voltage of transistor T2 is Vcc2 provided by the power management unit 2 shown in FIG. 6 with an inductor providing signal isolation between the RF and DC paths. The DC collector bias current of T2 is controlled by the mirror T1 collector current. T1 is a diode connected transistor with a collector current determined by the Vref voltage (from the LDO) and the 2500 ohm resistor. The other resistors and D1 are used to bias the diode D2 in a nearly linear region. The amplified Vin signal appears at the collector of T2 and is transferred via capacitor C1 to the anode of diode D2. D2 acts as a rectified peak detector. The peak voltage signal of the amplified Vin signal (minus the D2 diode drop) is held on C2 and output to the DC to DC converter 70 and bypass controller 74 as Pdet. In this preferred embodiment, the diode D2 is biased to pass substantially no current at the lowest power output and about 0.25 mA at the maximum power output.

Figure 8:
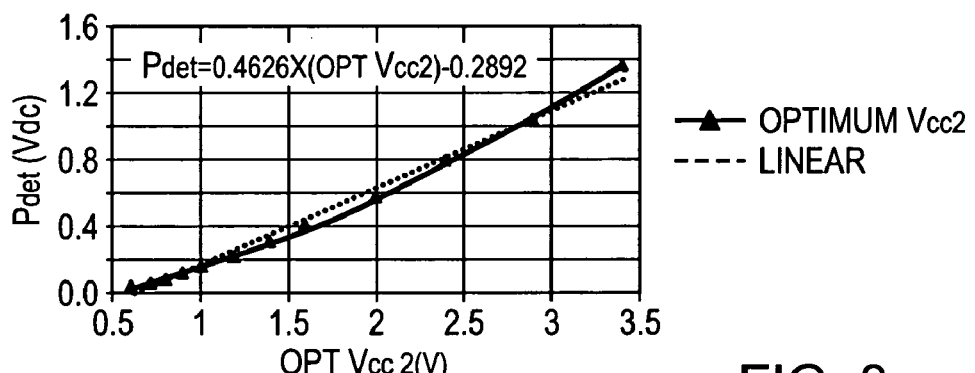
FIG. 8 is a graph of an ideal linear detector and one using a linear biased diode.

FIG. 8 shows the relationship between the Pdet and the optimum Vcc2 output from the DC to DC converter. The traces illustrate the small differences between a linear line and that achieved with the diode D2, as biased, in the power detector of FIG. 7. With the components used in FIG. 7, the relationship is approximately, Pdet=0.4626×(OPT Vcc2)−0.2892.

As implemented herein the voltage, Vin, from the first stage of the power amplifier to the power detector 4 is used to adjust linearly the optimum supply voltage, Vcc2, that supplies current and optimizes the output power of the power amplifier. The output power of the power amplifier is proportional to the square of the voltage Vin. The power detector 4 outputs an DC voltage, Pdet, which is proportional to the voltage Vin. The DC to DC converter outputs a supply voltage Vcc2, which is linearly related to the voltage Vin. The maximum output voltage signal swing of the power amplifier is proportional to the square of the supply voltage Vcc2. The maximum output power from the power amplifier is therefore directly proportional to the square of Vcc2. Thus, the linear relationship between Pdet and Vcc2 is achieved, and the optimum output power of the power amplifier is controlled by Vcc2 accordingly. With this linear output relationship, the detector DC output voltage, Pdet, can control the DC to DC converter output directly, and eliminates the need of any look-up-table or complicated controller circuits used in the prior art. In addition, the prior art related the output current to the output power from the (I)(V)=power relationship, whereas the present invention relies on the (Vcc2)$^2$/R=power relationship.

Figure 9:
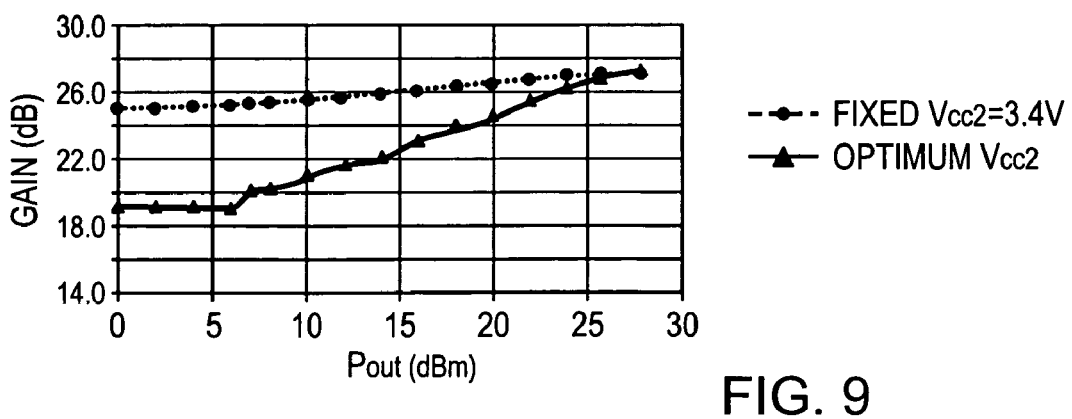
FIG. 9 is a graph of the gain of a power amplifier made in accordance with the present invention and a prior art amplifier.

FIG. 9 illustrates the gain as a function of the output power of the two PA's in a particular embodiment. The top trace 90 is the gain for a PA biased with the battery voltage only. The lower trace shows the gain for the PA with optimized bias supply voltage Vcc2.

At low output power there is a minimum gain of about 19 dB and the minimum Vcc2 (FIG. 4) is about +0.6 V. These levels are representative and other values may be used in other applications.

Figure 10:
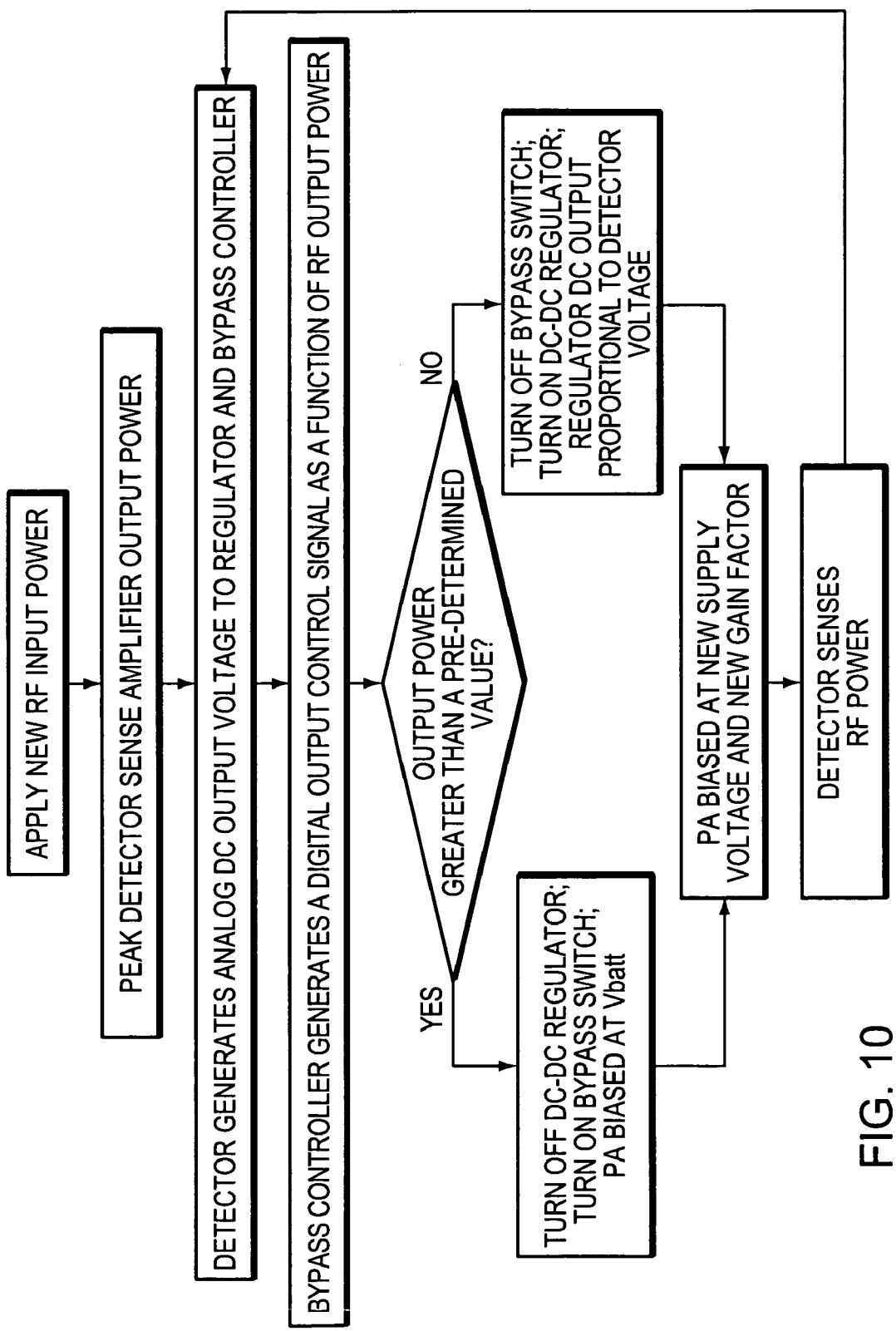
FIG. 10 is a flow chart illustrating an embodiment of the present invention.

FIG. 10 is a flow chart of the operation of the circuitry of FIG. 6, described above. Here the independent variable is the RF input signal. This signal power level changes as the distance, say from a handset to a tower antenna, changes. The present invention provides an optimum bias voltage to the power amplifier in response to a new RF input signal which corresponds to a particular output power from the power amplifier. The new RF input signal is amplified and sensed by a peak detector 4 that outputs a DC voltage, Pdet, to the DC to DC regulator 70 and the bypass controller 74. There is a comparison to a predetermined threshold in the bypass controller 74 where, if exceeded, the bypass switch 72 is activated and the DC to DC converter is deactivated. If the threshold is not exceeded the bypass switch is not activated and the regulator 70 provides a voltage bias, Vcc2, to the output power amplifier stage PA2, and, as shown in FIG. 6, to PA1. With a change in Vcc2, the gain of the power amplifier will change which affects the Pdet level, resulting in a change in Vcc2. This feedback loop will continue until the output power of the power amplifier reaches a steady state level.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. An RF power amplifier system comprising:
   at least a first and a second power amplifier;
   where a first RF signal is input to the first power amplifier that outputs a second RF signal, and wherein the second RF signal couples to the second power amplifier that outputs an RF output signal;
   an RF power detector that receives the second RF signal and provides a linearly related DC voltage detect signal;
   a DC to DC converter that receives the DC detect signal and outputs a corresponding supply voltage that is coupled to the second power amplifier, and wherein the second RF signal from the first power amplifier determines the optimum supply voltage for the second power amplifier, and the supply voltage determines the optimum output power from the second power amplifier; and
   the DC voltage detect signal from the power detector is linearly related to the optimum supply voltage for the second power amplifier.

2. The RF power amplifier system of claim 1 wherein the supply voltage is also coupled to the first power amplifier.

3. The RF power amplifier system of claim 1 wherein the RF power detector includes a diode peak detector that rectifies the second RF signal and which diode is forward biased in a substantially linear range.

4. The RF power amplifier system of claim 1 further comprising:
   a bypass switch, wherein when the bypass switch is activated the output of a battery is directly coupled to the second power amplifier.

5. The RF power amplifier system of claim 4 further comprising a threshold setting, wherein when the threshold is met the bypass switch is activated.

6. A process for optimizing the RF output signal from an RF power amplifier system, the process comprising the steps of:
   receiving a first RF signal at a first power amplifier that outputs a second RF signal;
   receiving the second RF signal at a second power amplifier, and wherein the second power amplifier outputs an RF output signal;
   detecting the second RF signal and providing a DC voltage detect signal to a DC to DC converter;
   generating a supply voltage from the DC to DC converter that is linearly related to the DC voltage detect signal; and
   coupling the supply voltage to the second power amplifier, and wherein the supply voltage determines the optimum output power from the second power amplifier.

7. The process of claim 6 further comprising the step of coupling a changed supply voltage to the first power amplifier activates a feedback loop of operations, wherein the gain of the first power amplifier changes causing, in turn: a change in the second RF signal, the related DC voltage detect signal, the supply voltage from the DC to DC converter, and finally back to the gain of the first power amplifier, wherein the feedback loop continues until a new supply voltage stabilizes at the optimum output power.

8. The process of claim 6 wherein the step of detecting includes passing the RF signal through a peak detector diode that is forward biased in a substantially linear region and that detects and rectifies the second RF signal.

9. The process of claim 6 further comprising the step of:
   activating a bypass switch that connects a battery directly to the second power amplifier.

10. The process of claim 9 further comprising the step of thresholding the DC voltage detect signal, wherein when the threshold is met the bypass switch is activated.

* * * * *